(12) United States Patent
Kim et al.

(10) Patent No.: US 11,682,663 B2
(45) Date of Patent: Jun. 20, 2023

(54) THERMALLY ISOLATED SILICON-BASED DISPLAY

(71) Applicant: META PLATFORMS TECHNOLOGIES, LLC, Menlo Park, CA (US)

(72) Inventors: Young Bae Kim, San Jose, CA (US); Donghee Nam, San Jose, CA (US); Min Hyuk Choi, San Jose, CA (US); Zhiming Zhuang, Sammamish, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 87 days.

(21) Appl. No.: 17/098,494

(22) Filed: Nov. 16, 2020

(65) Prior Publication Data

US 2022/0157798 A1    May 19, 2022

(51) Int. Cl.

| | |
|---|---|
| H01L 25/18 | (2023.01) |
| G09G 3/3275 | (2016.01) |
| H01L 23/00 | (2006.01) |
| H10K 19/20 | (2023.01) |
| H10K 59/12 | (2023.01) |
| H01L 25/00 | (2006.01) |
| H10K 71/00 | (2023.01) |

(52) U.S. Cl.
CPC ........... *H01L 25/18* (2013.01); *G09G 3/3275* (2013.01); *H01L 24/80* (2013.01); *H01L 25/50* (2013.01); *H10K 19/20* (2023.02); *H10K 59/12* (2023.02); *H10K 71/00* (2023.02); *G09G 2300/0452* (2013.01); *G09G 2300/08* (2013.01); *G09G 2310/0297* (2013.01); *H01L 2224/80007* (2013.01); *H01L 2224/80098* (2013.01); *H01L 2224/80203* (2013.01)

(58) Field of Classification Search
None
See application file for complete search history.

(56) References Cited

U.S. PATENT DOCUMENTS

| | | | |
|---|---|---|---|
| 9,646,874 B1 * | 5/2017 | Wojciechowski | ........................... H01L 21/30604 |
| 9,824,932 B1 * | 11/2017 | Wojciechowski | .. H01L 21/3213 |
| 2016/0027718 A1 | 1/2016 | Park et al. | |

(Continued)

FOREIGN PATENT DOCUMENTS

| | | | | |
|---|---|---|---|---|
| TW | I546653 B | * | 8/2016 | ............. B01D 47/06 |
| WO | WO-2013143156 A1 | * | 10/2013 | ............... F21V 29/74 |
| WO | WO-2020020244 A1 | * | 1/2020 | ......... H01L 27/3276 |

OTHER PUBLICATIONS

English translation to TW 1546653 B (Year: 2016).*

(Continued)

*Primary Examiner* — Telly D Green
(74) *Attorney, Agent, or Firm* — Greenberg Traurig, LLP

(57) ABSTRACT

A display system includes (a) a display element having an organic light emitting diode-containing display active area disposed over a silicon backplane, (b) a display driver integrated circuit (DDIC) attached to the display element and electrically connected with the display active area, and (c) a thermal barrier disposed within the silicon backplane, where the thermal barrier is configured to inhibit heat flow through the silicon backplane and into the display active area.

15 Claims, 10 Drawing Sheets

(56) References Cited

U.S. PATENT DOCUMENTS

2017/0170415 A1 6/2017 Yu et al.
2020/0251049 A1 8/2020 Morris et al.

OTHER PUBLICATIONS

International Search Report and Written Opinion for International Application No. PCT/US2021/059291, dated Feb. 21, 2022, 9 pages.

* cited by examiner

THERMALLY ISOLATED SILICON-BASED DISPLAY

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
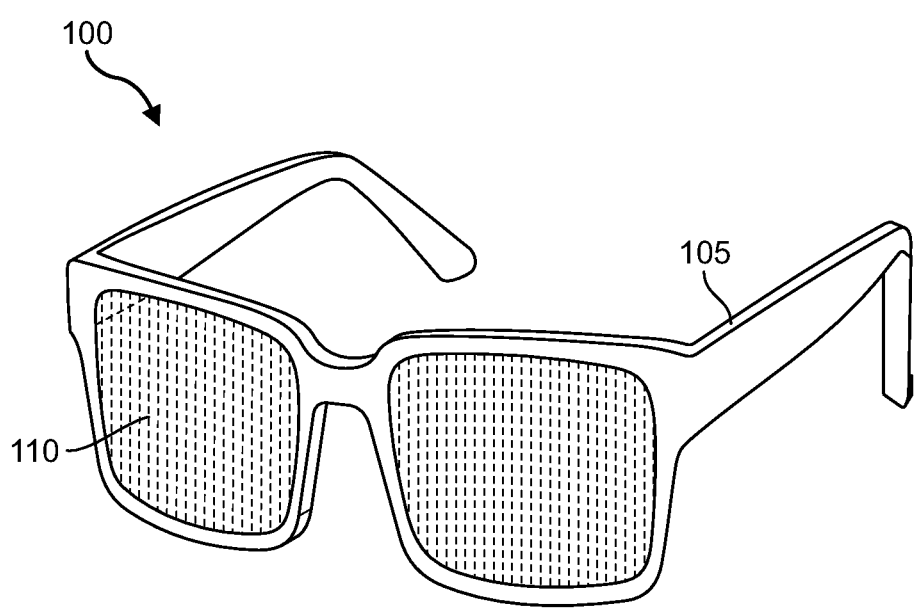
FIG. 1 is a diagram of a head-mounted display (HMD) that includes a near-eye display (NED) according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

Optical displays are ubiquitous in emerging technologies, including wearable devices, smart phones, tablets, laptops, desktop computers, and other display systems. Many display systems used in such technologies are based on light emitting diodes (LEDs), including organic light emitting diodes (OLEDs). The present disclosure relates generally to display systems and, more specifically, to methods of manufacturing organic light emitting diode (OLED)-based displays, as well as the resulting display system architectures.

A light emitting diode-based display system can be manufactured by assembling an array of individual LED display elements. One or more LED display elements can be grouped to form pixels. The display system may additionally include control circuitry to generate and distribute control signals to control each pixel to project an image. A backplane may provide structural support for the LED display elements and enable electrical connections to transmit the control signals to the pixels. Integration of the LED display elements with the backplane and with additional circuits, such as display driver circuits, can affect pixel-level interconnects, including the size and density of a pixel array, and ultimately the quality and performance of the display system. According to some embodiments, the instant display systems may include OLEDs as well as micro-OLEDs and may be incorporated into a variety of form factors, such as wearable near-eye displays (NEDs).

Notwithstanding recent developments, it would be advantageous to provide improved integration and packaging schemes for the economical manufacture of large area, performance-enhanced light emitting diode-based displays. In this regard, Applicants have shown that, in contrast to the dielectric backplane used in many comparative OLED architectures, the implementation of a semiconductor (e.g., silicon) backplane may enable a variety of performance advantages.

A silicon backplane may include single crystal silicon. The term "single crystal" as used herein denotes a crystalline solid, in which the crystal lattice of the entire solid is substantially continuous and substantially unbroken to the edges of the solid with substantially no grain boundaries. In alternate embodiments, a silicon backplane may include polycrystalline silicon.

Throughout the instant specification, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

The silicon backplane may be doped. In some embodiments, doping may be performed in situ, i.e., during epitaxial growth of the silicon backplane, or following epitaxial growth or a bulk (e.g., a Czochralski) formation process, using ion implantation or plasma doping. Doping changes the electron and hole carrier concentrations of an intrinsic semiconductor at thermal equilibrium. A doped layer or region of the backplane may be p-type or n-type As used herein, "p-type" refers to the addition of impurities to an intrinsic semiconductor that creates a deficiency of valence electrons. Example p-type dopants, i.e., impurities, include but are not limited to boron, aluminum, gallium, and indium. As used herein, "n-type" refers to the addition of impurities that contribute free electrons to an intrinsic semiconductor. In a further example silicon backplane, example n-type dopants, i.e., impurities, include but are not limited to, antimony, arsenic, and phosphorus.

An optional drive-in anneal can be used to diffuse dopant species and generate a desired dopant profile. In certain embodiments, dopant atoms within the backplane may be diffused using a post-epitaxy or post-implantation anneal.

According to some embodiments, the higher carrier mobility of a single crystal silicon backplane (i.e., relative to glass, polymer, or even polycrystalline semiconductors) and the attendant improvements in device operating speed may enable the creation of an increasingly complex data selection interface between the display elements and the display driver circuitry. A higher density data selection interface may enable higher pixel densities within the display active area and higher quality images, including a higher contrast ratio and greater output brightness than achievable from comparative architectures.

A data selection interface may include one or more multiplexers having a ratio of input channels to an output channel of at least 4, e.g., 4, 8, 12, 16, 18, 20, or 24, although still higher density multiplexers are contemplated. A multiplexer may be configured to select between plural analog or digital input signals and forward the selected signal to a single output line. A multiplexer may enable several signals to share one device or resource.

In certain embodiments, a display element may be electrically connected to the display driver integrated circuit via the multiplexer. In some embodiments, the display element may be attached to a flexible substrate and the display active area electrically connected to the display driver integrated circuit (DDIC) by a wire bond or solder ball array. The foregoing architecture may enable large area displays, including displays having at least one lateral dimension greater than approximately 1.5 inches.

As will be appreciated, however, the higher thermal conductivity of silicon relative to glass, polyimide, or other dielectrics may limit the available thermal budget during manufacture of such a device. For instance, heat generated during the formation of backend electrical interconnects, e.g., between the display elements and a DDIC, may flow through the silicon backplane and adversely affect the organic layers within the display active area.

In view of the foregoing, and in accordance with various embodiments, a silicon backplane may include a thermal barrier that is configured to block or redirect the flow of heat within the backplane. A thermal barrier may be thermally insulative or thermally conductive, i.e., relative to silicon, and may be located between the display active area and one or more sources of heat, including heat produced during manufacture and/or during operation of the device.

Example thermal barriers may be formed by depositing a layer of a thermally insulative or thermally conductive material over a surface of a silicon backplane or by etching vias or trenches into the silicon and back-filling the vias or trenches with a suitable thermally insulative or thermally conductive material.

In some embodiments, one or more layers of a thermally insulative material may be configured to block heat flow within the silicon backplane. Example thermally insulative materials may be characterized by a thermal conductivity of less than approximately 1.5 W/mK over a temperature range of from approximately 25° C. to approximately 300° C., and may include various metal oxides, such as silicon dioxide or indium gallium zinc oxide (IGZO), although further thermally insulative materials are contemplated.

In some embodiments, one or more layers of a thermally conductive material may be configured to redirect or dissipate heat flow within the silicon backplane. Example thermally conductive materials may be characterized by a thermal conductivity of greater than approximately 200 W/mK over a temperature range of from approximately 25° C. to approximately 300° C., and may include various metals and metal alloys, such as copper or aluminum, although further thermally conductive materials are contemplated, such as silicon nitride or boron nitride.

As described herein, the formation or deposition of a layer or structure, including thermally insulative layers and thermally conductive layers, may involve one or more techniques suitable for the material or layer being deposited or the structure being formed. In addition to techniques or methods specifically mentioned, various techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

The formation of a thermal barrier may include etching or drilling into the silicon backplane to form openings, and then filling the openings with an insulative or conductive material. A drill may be a mechanical drill or a laser drill. Excess fill material may be removed, e.g., using chemical mechanical polishing. The remaining portions of the insulative or conductive material within or overlying the silicon backplane may form the thermal barrier(s).

In certain examples, the openings may include vias that extend partially through or entirely through the silicon backplane. Vias may have a substantially circular cross section and may include substantially straight sidewalls. The sidewalls may be vertical or tapered, i.e., with respect to a major surface of the silicon backplane. Such openings may be characterized by a diameter of from approximately 5 micrometers to approximately 100 micrometers.

In further examples, the openings may include trenches that extend partially through or entirely through the silicon backplane. In some examples, a trench may have a substantially rectangular cross section. Trench sidewalls may be vertical or tapered, i.e., with respect to a major surface of the silicon backplane. In some embodiments, a thermal barrier structure may include a plurality of vias and/or trenches formed within a silicon backplane that cooperate to thermally isolate the display active area of an example display system from excess heat. Reference herein to a via or a trench includes embodiments where the via or trench is at least partially filled with a fill material.

A display system may include a display element having an LED-containing (e.g., OLED-containing or micro-OLED-containing) display active area disposed over a silicon backplane, a display driver integrated circuit (DDIC) attached to the display element and electrically connected with the display active area, and a multiplexer disposed between the display element and the display driver integrated circuit. The display driver integrated circuit may be formed on a flexible substrate. A thermal barrier formed on and/or within the silicon backplane may isolate the display active area from heat that is introduced to the display system, e.g., during formation of the electrical connections.

In certain embodiments, a method of manufacturing an LED-based display may include forming a display element including a display active area disposed over a silicon backplane, forming a display driver integrated circuit (DDIC), and bonding the display element to the display driver integrated circuit. Thus, the display and the DDIC may be manufactured separately and then joined, i.e., physically bonded and electrically interconnected. Because design rules for the display and the DDIC may not be co-extensive, separate manufacturing paradigms may be used to improve the economics of the overall process. For instance, separate manufacture of the display and the DDIC may decrease the total number of required critical masks and/or increase manufacturing flexibility in one or both sub-processes.

In addition, by using a silicon backplane to form the display, the greater carrier mobility and the associated improvements in operating speed may enable the formation of an increasingly complex data selection interface (i.e., multiplexer interface) between the display element(s) and the display driver circuitry. Higher density multiplexers support the realization of higher pixel densities and higher quality images. For instance, according to some embodiments, a multiplexer may have 4 or more inputs (e.g., 4, 8, 12, 16, 18, 20, 22, 24 or more inputs) for each output.

As will be appreciated, the LED-based displays described herein may include microLEDs. Moreover, the LED-based displays may include organic LEDs (OLEDS), including micro-OLEDs. The LED-based displays may be incorporated into a variety of devices, such as wearable near-eye displays (NEDs).

Features from any of the above-mentioned embodiments may be used in combination with one another according to the general principles described herein. These and other embodiments, features, and advantages will be more fully understood upon reading the following detailed description in conjunction with the accompanying drawings and claims.

The following will provide, with reference to FIGS. 1-11, a detailed description of LED devices, systems, and methods of manufacture. The discussion associated with FIGS. 1-3 relates to an example near-eye display (NED). The discussion associated with FIGS. 4-7 includes a description of an OLED and an OLED package in accordance with various embodiments. The discussion associated with FIG. 8 includes a description of an assembly apparatus for manufacturing an OLED package having a thermal barrier within a silicon backplane. The discussion associated with FIGS. 9-11 relates to various virtual reality platforms that may include a display device as described herein.

FIG. 1 is a diagram of a near-eye-display (NED) 100, in accordance with some embodiments. The NED 100 may present media to a user. Examples of media that may be presented by the NED 100 include one or more images, video, audio, or some combination thereof. In some embodiments, audio may be presented via an external device (e.g., speakers and/or headphones) that receives audio information from the NED 100, a console (not shown), or both, and presents audio data to the user based on the audio information. The NED 100 is generally configured to operate as a virtual reality (VR) NED. However, in some embodiments, the NED 100 may be modified to operate as an augmented reality (AR) NED, a mixed reality (MR) NED, or some combination thereof. For example, in some embodiments, the NED 100 may augment views of a physical, real-world environment with computer-generated elements (e.g., images, video, sound, etc.).

The NED 100 shown in FIG. 1 may include a frame 105 and a display 110. The frame 105 may include one or more optical elements that together display media to a user. That is, the display 110 may be configured for a user to view the content presented by the NED 100. As discussed below in conjunction with FIG. 2, the display 110 may include at least one source assembly to generate image light to present media to an eye of the user. The source assembly may include, e.g., a source, an optics system, or some combination thereof.

It will be appreciated that FIG. 1 is merely an example of a virtual reality system, and the display systems described herein may be incorporated into further such systems. In some embodiments, FIG. 1 may also be referred to as a head-mounted display (HMD).

Figure 2:
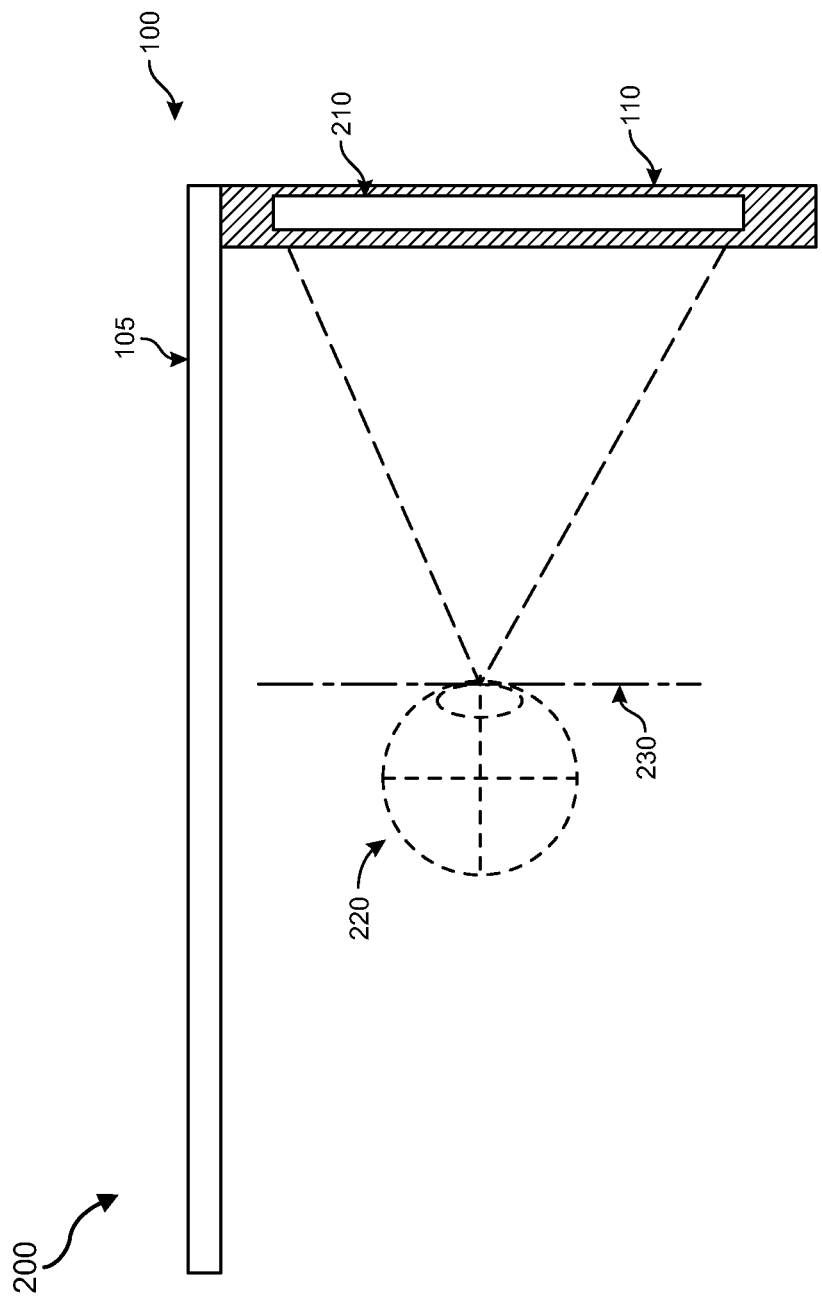
FIG. 2 is a cross-sectional view of the HMD illustrated in FIG. 1 according to some embodiments.

FIG. 2 is a cross section 200 of the NED 100 illustrated in FIG. 1, in accordance with some embodiments of the present disclosure. The cross section 200 includes at least one display assembly 210, and an exit pupil 230. The exit pupil 230 is a location where the eye 220 may be positioned when the user wears the NED 100. In some embodiments, the frame 105 may represent a frame of eye-wear glasses. For purposes of illustration, FIG. 2 shows the cross section 200 associated with a single eye 220 and a single display assembly 210, but in alternative embodiments not shown, another display assembly that is separate from the display assembly 210 shown in FIG. 2, may provide image light to another eye of the user.

The display assembly 210, as illustrated in FIG. 2, may be configured to direct the image light to the eye 220 through the exit pupil 230. The display assembly 210 may be composed of one or more materials (e.g., plastic, glass, etc.) with one or more refractive indices that effectively decrease the weight and widen a field of view of the NED 100.

In alternate configurations, the NED 100 may include one or more optical elements (not shown) between the display assembly 210 and the eye 220. The optical elements may act to, by way of various examples, correct aberrations in image light emitted from the display assembly 210, magnify image light emitted from the display assembly 210, perform some other optical adjustment of image light emitted from the display assembly 210, or combinations thereof. Example optical elements may include an aperture, a Fresnel lens, a convex lens, a concave lens, a filter, or any other suitable optical element that may affect image light.

In some embodiments, the display assembly 210 may include a source assembly to generate image light to present media to a user's eyes. The source assembly may include, e.g., a source, an optics system, or some combination thereof.

Figure 3:
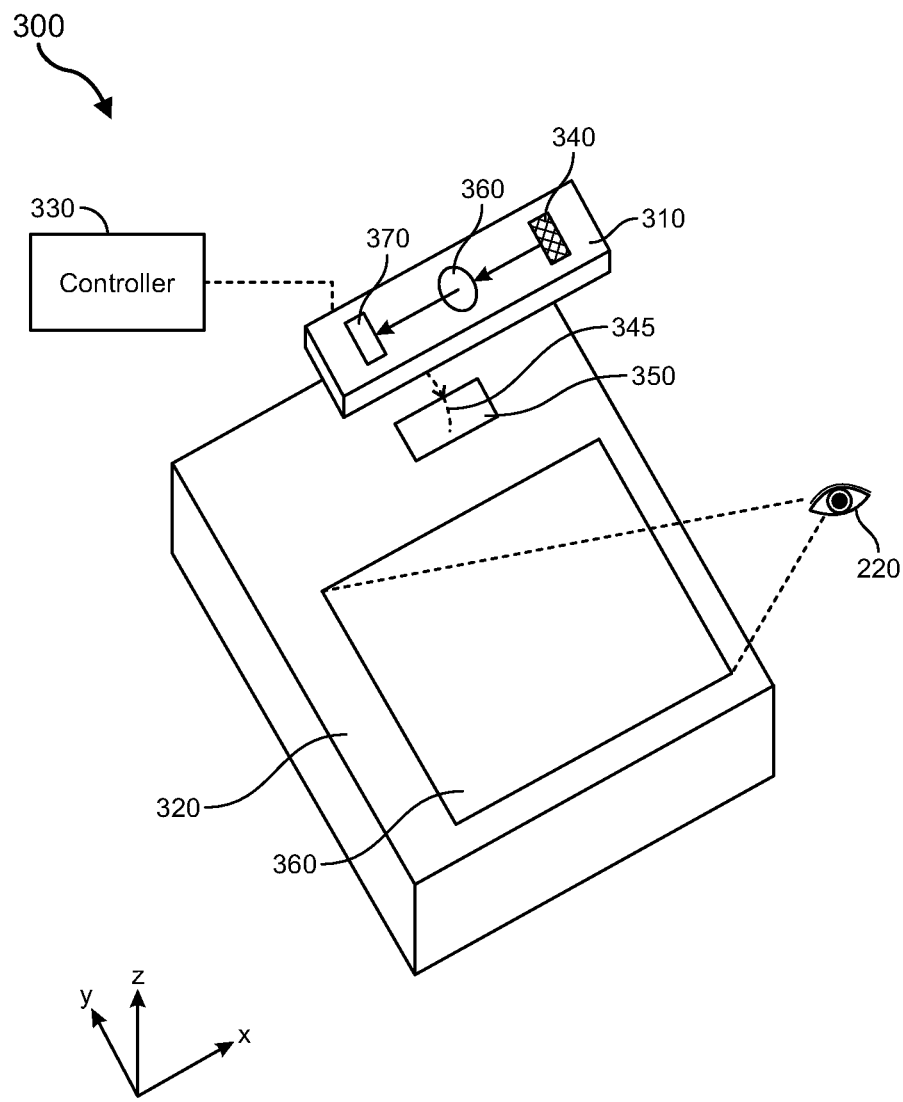
FIG. 3 illustrates an isometric view of a waveguide display in accordance with various embodiments.

FIG. 3 illustrates an isometric view of a waveguide display 300 in accordance with some embodiments. In some embodiments, the waveguide display 300 may be a component (e.g., display assembly 210) of NED 100. In alternate embodiments, the waveguide display 300 may constitute a part of some other NED, or other system that directs display image light to a particular location.

The waveguide display 300 may include a source assembly 310, an output waveguide 320, and a controller 330. For purposes of illustration, FIG. 3 shows the waveguide display 300 associated with a single eye 220, but in some embodiments, another waveguide display separate (or partially separate) from the waveguide display 300 may provide image light to another eye of the user. In a partially separate system, for instance, one or more components may be shared between waveguide displays for each eye.

The source assembly 310 generates image light. The source assembly 310 may include a source 340, a light conditioning assembly 360, and a scanning mirror assembly 370. The source assembly 310 may generate and output image light 345 to a coupling element 350 of the output waveguide 320.

The source 340 may include a source of light that generates at least a coherent or partially coherent image light 345. The source 340 may emit light in accordance with one or more illumination parameters received from the controller 330. The source 340 may include one or more source elements, including, but not restricted to light emitting diodes, such as micro-OLEDs, as described in detail below with reference to FIGS. 4-8.

The output waveguide 320 may be configured as an optical waveguide that outputs image light to an eye 220 of a user. The output waveguide 320 receives the image light 345 through one or more coupling elements 350 and guides the received input image light 345 to one or more decoupling elements 360. In some embodiments, the coupling element 350 couples the image light 345 from the source assembly 310 into the output waveguide 320. The coupling element 350 may be, for example, a diffraction grating, a holographic grating, some other element that couples the image light 345 into the output waveguide 320, or some combination thereof. For example, in embodiments where the coupling element 350 is a diffraction grating, the pitch of the diffraction grating may be chosen such that total internal reflection occurs, and the image light 345 propagates internally toward the decoupling element 360. For example, the pitch of the diffraction grating may be in the range of approximately 300 nm to approximately 600 nm.

The decoupling element 360 decouples the total internally reflected image light from the output waveguide 320. The decoupling element 360 may be, for example, a diffraction grating, a holographic grating, some other element that decouples image light out of the output waveguide 320, or some combination thereof. For example, in embodiments where the decoupling element 360 is a diffraction grating, the pitch of the diffraction grating may be chosen to cause incident image light to exit the output waveguide 320. An orientation and position of the image light exiting from the output waveguide 320 may be controlled by changing an orientation and position of the image light 345 entering the coupling element 350.

The output waveguide 320 may be composed of one or more materials that facilitate total internal reflection of the image light 345. The output waveguide 320 may be composed of, for example, silicon, plastic, glass, or a polymer, or some combination thereof. The output waveguide 320 may have a relatively small form factor such as for use in a head-mounted display. For example, the output waveguide 320 may be approximately 50 mm wide along an x-dimension, approximately 30 mm long along a y-dimension, and approximately 0.5-1 mm thick along a z-dimension. In some embodiments, the output waveguide 320 may be a planar (2D) optical waveguide.

The controller 330 may be used to control the scanning operations of the source assembly 310. In certain embodiments, the controller 330 may determine scanning instructions for the source assembly 310 based at least on the one or more display instructions. Scanning instructions may include instructions used by the source assembly 310 to generate image light 345. The scanning instructions may include, e.g., a type of a source of image light (e.g. monochromatic, polychromatic), a scanning rate, an orientation of scanning mirror assembly 370, and/or one or more illumination parameters, etc. Display instructions may include instructions to render one or more images. In some embodiments, display instructions may include an image file (e.g., bitmap). The display instructions may be received from, e.g., a console of a virtual reality system (not shown). The controller 330 may include a combination of hardware, software, and/or firmware not shown here so as not to obscure other aspects of the disclosure.

According to some embodiments, source 340 may include a light emitting diode (LED), such as an organic light emitting diode (OLED). An organic light-emitting diode (OLED) is a light-emitting diode (LED) having an emissive electroluminescent layer that may include a thin film of an organic compound that emits light in response to an electric current. The organic layer is typically situated between a pair of conductive electrodes. One or both of the electrodes may be transparent.

As will be appreciated, an OLED display can be driven with a passive-matrix (PMOLED) or active-matrix (AMOLED) control scheme. In a PMOLED scheme, each row (and line) in the display may be controlled sequentially, whereas AMOLED control typically uses a thin-film transistor backplane to directly access and switch each individual pixel on or off, which allows for higher resolution and larger display areas.

Figure 4:
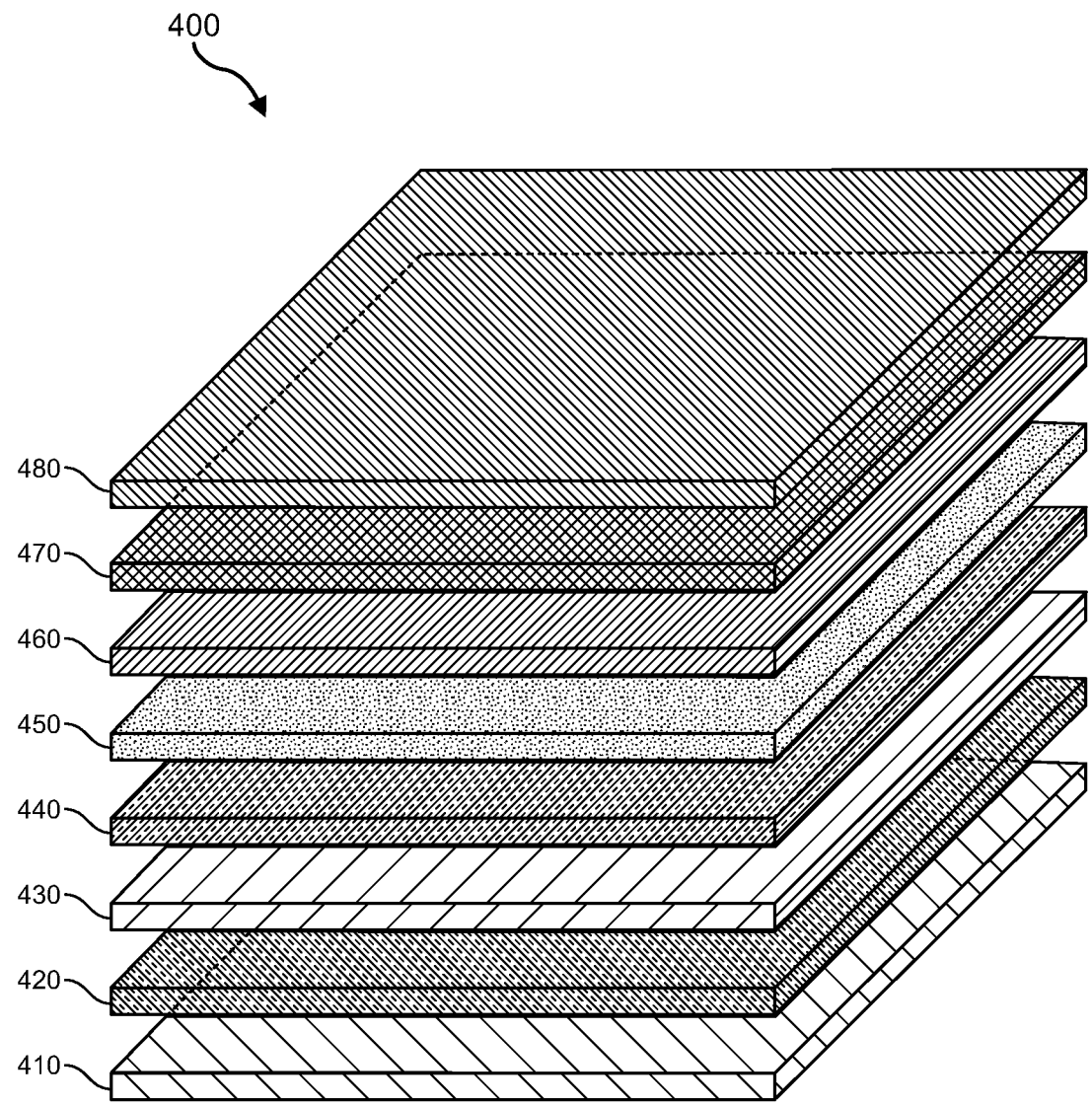
FIG. 4 depicts a simplified OLED structure according to some embodiments.

A simplified structure of an OLED according to some embodiments is depicted in FIG. 4. As shown in an exploded view, OLED 400 may include, from bottom to top, a substrate 410, anode 420, hole injection layer 430, hole transport layer 440, emissive layer 450, blocking layer 460, electron transport layer 470, and cathode 480. In some embodiments, substrate (or backplane) 410 may include single crystal or polycrystalline silicon or other suitable semiconductor (e.g., germanium).

Anode 420 and cathode 480 may include any suitable conductive material(s), such as transparent conductive oxides (TCOs, e.g., indium tin oxide (ITO), zinc oxide (ZnO), and the like). The anode 420 and cathode 480 may be configured to inject holes and electrons, respectively, into the organic layer(s) within emissive layer 450 during operation of the device.

The hole injection layer 430, which is disposed over the anode 420, receives holes from the anode 420 and is configured to inject the holes deeper into the device, while the adjacent hole transport layer 440 may support the transport of holes to the emissive layer 450. The emissive layer 450 converts electrical energy to light. Emissive layer 450 may include one or more organic molecules, or light-emitting fluorescent dyes or dopants, which may be dispersed in a suitable matrix.

Blocking layer 460 may improve device function by confining electrons (charge carriers) to the emissive layer 450. Electron transport layer 470 may support the transport of electrons from the cathode 480 to the emissive layer 450.

In some embodiments, the generation of red, green, and blue light (to render full-color images) may include the formation of red, green, and blue OLED sub-pixels in each pixel of the display. Alternatively, the OLED 400 may be adapted to produce white light in each pixel. The white light may be passed through a color filter to produce red, green, and blue output.

Any suitable deposition process(es) may be used to form OLED 400. For example, one or more of the layers constituting the OLED may be fabricated using physical vapor deposition (PVD), chemical vapor deposition (CVD), evaporation, spray-coating, spin-coating, atomic layer deposition (ALD), and the like. In further aspects, OLED 400 may be manufactured using a thermal evaporator, a sputtering system, printing, stamping, etc.

According to some embodiments, OLED 400 may be a micro-OLED. A "micro-OLED," according to various examples, may refer to a particular type of OLED having a small active light emitting area (e.g., less than 2,000 $\mu m^2$ in some embodiments, less than 20 $\mu m^2$ or less than 10 $\mu m^2$ in other embodiments). In some embodiments, the emissive surface of the micro-OLED may have a diameter of less than approximately 2 $\mu m$. Such a micro-OLED may also have collimated light output, which may increase the brightness level of light emitted from the small active light emitting area.

Figure 5:
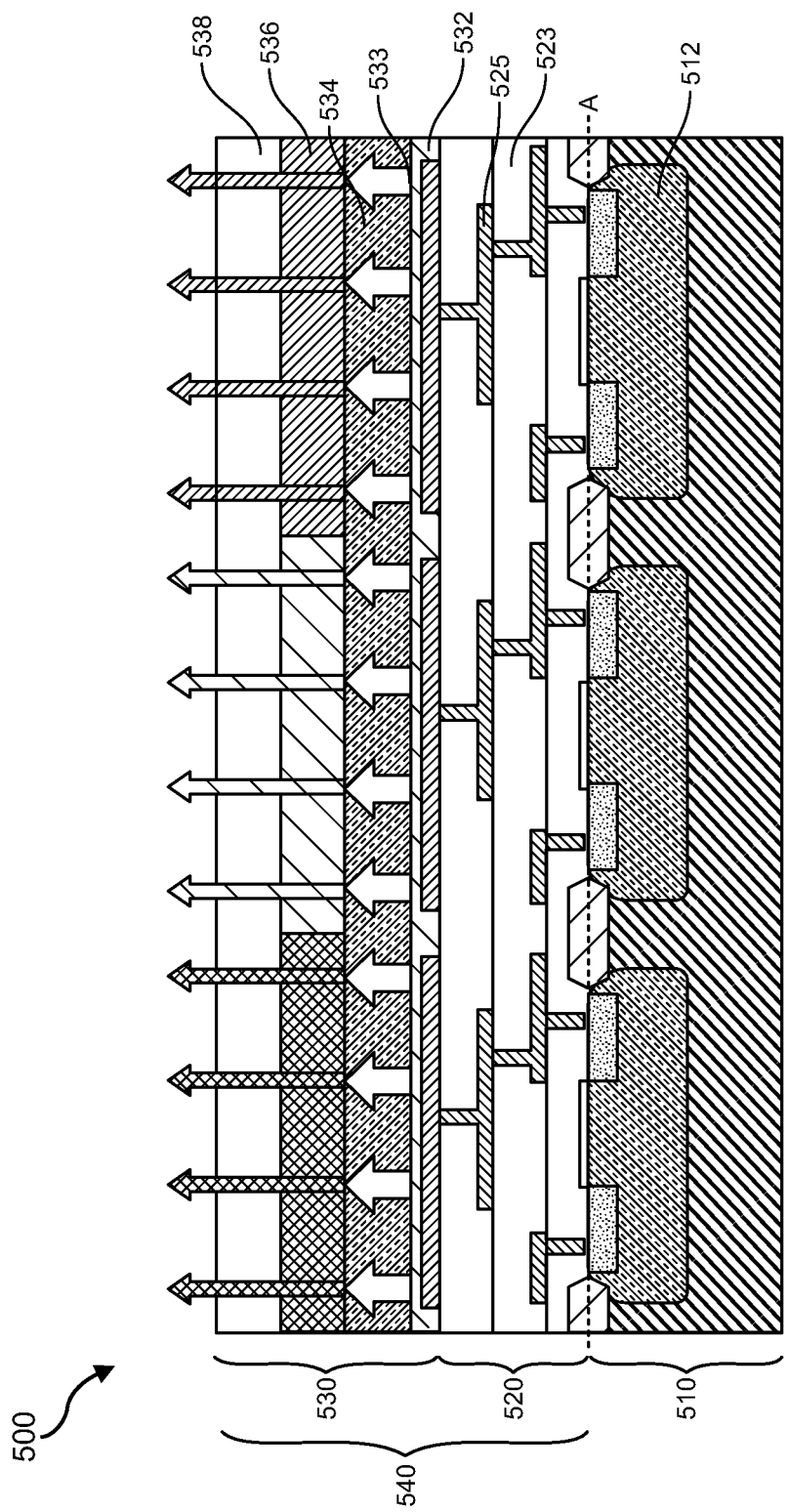
FIG. 5 is a schematic view of an OLED display according to some embodiments.

An example OLED device is shown schematically in FIG. 5. According to some embodiments, OLED device 500 (e.g., micro-OLED chip) may include a display active area 530 having an active matrix 532 (such as OLED 400) disposed over a single crystal (e.g., silicon) backplane 520. Active matrix 532 may include an upper emissive surface 533. The combined display/backplane architecture, i.e., display element 540 may be bonded (e.g., at or about interface A) to a display driver integrated circuit (DDIC) 510. As illustrated, DDIC 510 may include an array of driving transistors 512, which may be formed using conventional CMOS processing as will be appreciated by those skilled in the art. One or more display driver integrated circuits may be formed over a single crystal (e.g., silicon) substrate.

In some embodiments, the display active area 530 may have at least one areal dimension (i.e., length or width) greater than approximately 1.3 inches, e.g., approximately 1.5, 1.75, 2, 2.25, 2.5, 2.75, or 3 inches, including ranges between any of the foregoing values, although larger area displays are contemplated.

Silicon backplane 520 may include a single crystal or polycrystalline silicon layer 523 having a metallization structure 525 for electrically connecting the DDIC 510 with the display active area 530. Disposed over the upper emissive surface 533 of active matrix 532, in some embodiments, display active area 530 may further include, from bottom to top, a transparent encapsulation layer 534, a color filter 536, and cover glass 538.

According to various embodiments, the display active area 530 and underlying silicon backplane 520 may be manufactured separately from, and then later bonded to, DDIC 510, which may simplify formation of the OLED active area, including formation of the active matrix 532, color filter 536, etc.

Figure 6:
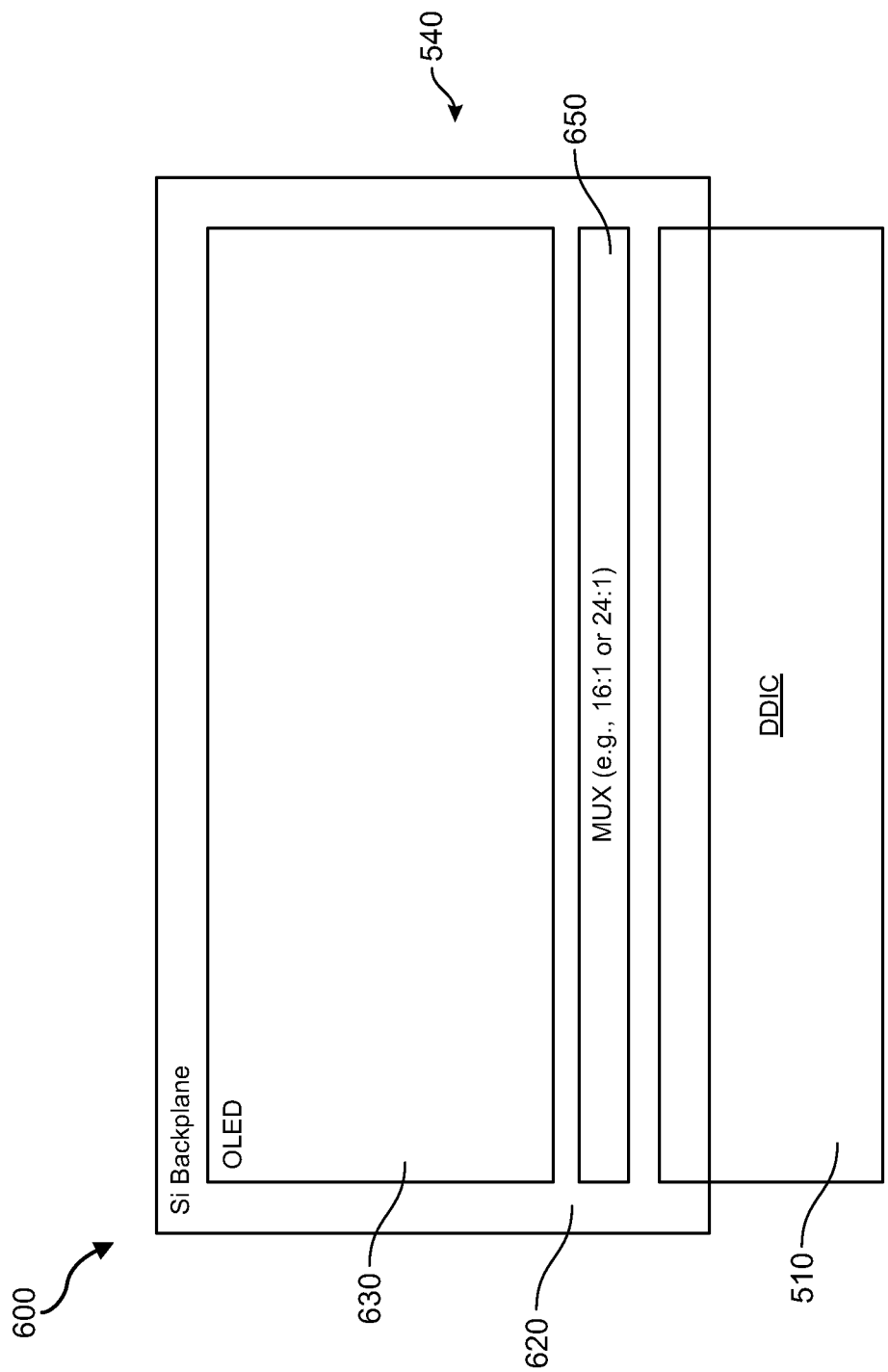
FIG. 6 is a schematic view of an OLED package according to certain embodiments.

According to some embodiments, and with reference to FIG. 6, a chip-on-flex (COF) packaging technology may be used to integrate display element 540 with DDIC 510, optionally via a data selector (i.e., multiplexer) array 650 to form a display 600. In the illustrated embodiment, a silicon backplane 620 may support display active area 630. In certain embodiments, DDIC 510 may be formed on a flexible substrate.

As used herein, the terms "multiplexer" or "data selector" may, in some examples, refer to a device adapted to combine or select from among plural analog or digital input signals, which are transmitted to a single output. Multiplexers may be used to increase the amount of data that can be communicated within a certain amount of space, time and bandwidth.

As used herein, "chip-on-flex" (COF) may, in some examples, refer to an assembly technology where a microchip or die, such as an OLED chip, is directly mounted on and electrically connected to a flexible circuit, such as a direct driver circuit. In a COF assembly, the microchip may avoid some of the traditional assembly steps used for individual IC packaging. This may simplify the overall processes of design and manufacture while improving performance and yield.

In accordance with certain embodiments, COF assembly may include attaching a die to a flexible substrate, electrically connecting (e.g., wire bonding) the chip to the flex circuit, and encapsulating the chip and wires, e.g., using an epoxy resin to provide environmental protection.

In some embodiments, an adhesive (not shown) used to bond the chip to the flex substrate may be thermally conductive or thermally insulative. In some embodiments, ultrasonic or thermosonic wire bonding techniques may be used to electrically connect the chip to the flex substrate.

Display driver integrated circuits (DDICs), which may also be referred to herein as driver ICs, may receive image data and deliver analog voltages or currents to activate one or more pixels within the display 600. As will be appreciated, driver ICs may include gate drivers and source drivers. In accordance with various embodiments, a gate driver may refer to a power amplifier that accepts a low-power input from a controller IC and produces a high-current drive input for the gate of a transistor, such as an insulated gate bipolar transistor (IGBT) or power metal-oxide-semiconductor field effect transistor (MOSFET). In some embodiments, a gate driver may be configured to turn on and off selected transistors within each pixel cell across a horizontal row of the display area. When the transistors are turned on, a source driver may generate voltages that are applied to each pixel cell on that row for data input. In some embodiments, a source driver may be integrated with a digital-to-analog converter (DAC) for generating analog output voltages from digital input data to drive individual pixels.

Figure 7:
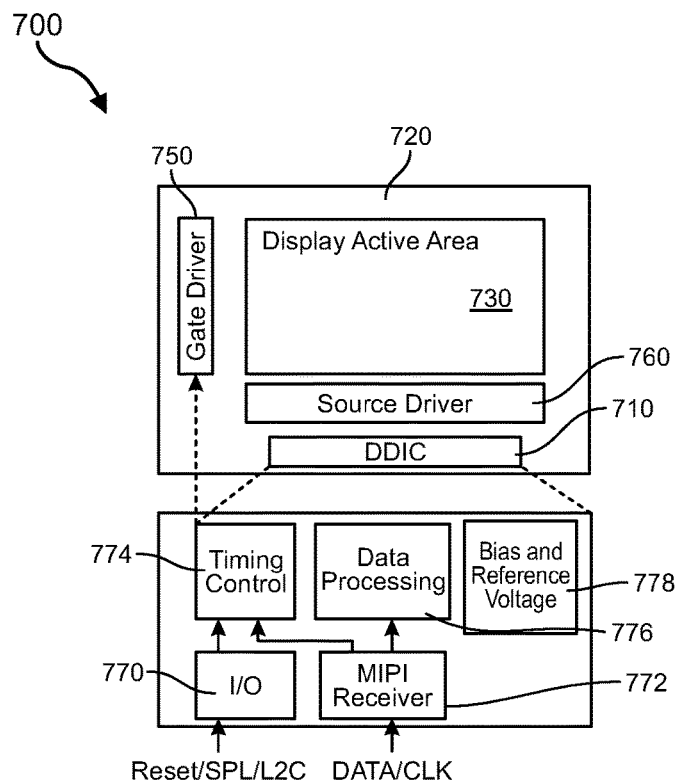
FIG. 7 is a schematic view of an OLED package according to further embodiments.

Referring to FIG. 7, shown is a micro-OLED display package where various control circuit elements may be removed from the silicon backplane and integrated into the display package via a discrete DDIC. In the embodiment of FIG. 7, display 700 may include a DDIC 710 coupled, e.g., via a multiplexer (not shown) to silicon backplane 720. Each of a display active area 730, gate driver 750, and source driver 760 may be formed over the silicon backplane 720. The DDIC 710 may include I/O interface 770, MIPI receiver 772, timing controller 774, data processing element 776, and bias and reference voltage elements 778.

The MIPI (mobile industry processor interface) receiver 772 may be a MIPI display serial interface (DSI), which may include a high-speed packet-based interface for delivering video data to the display. Timing controller 774 may be configured to receive image data and convert the data format for the source drivers' input. Timing controller 774 may also be configured to generate control signals for the gate and source drivers 750, 760.

According to an alternate (unillustrated) embodiment, the display active area 730 and gate driver 750 may be formed over the silicon backplane 720, whereas the source driver 760 may be incorporated into the DDIC 710 together with I/O interface 770, MIPI receiver 772, timing controller 774, data processing element 776, and bias and reference voltage elements 778.

Figure 8:
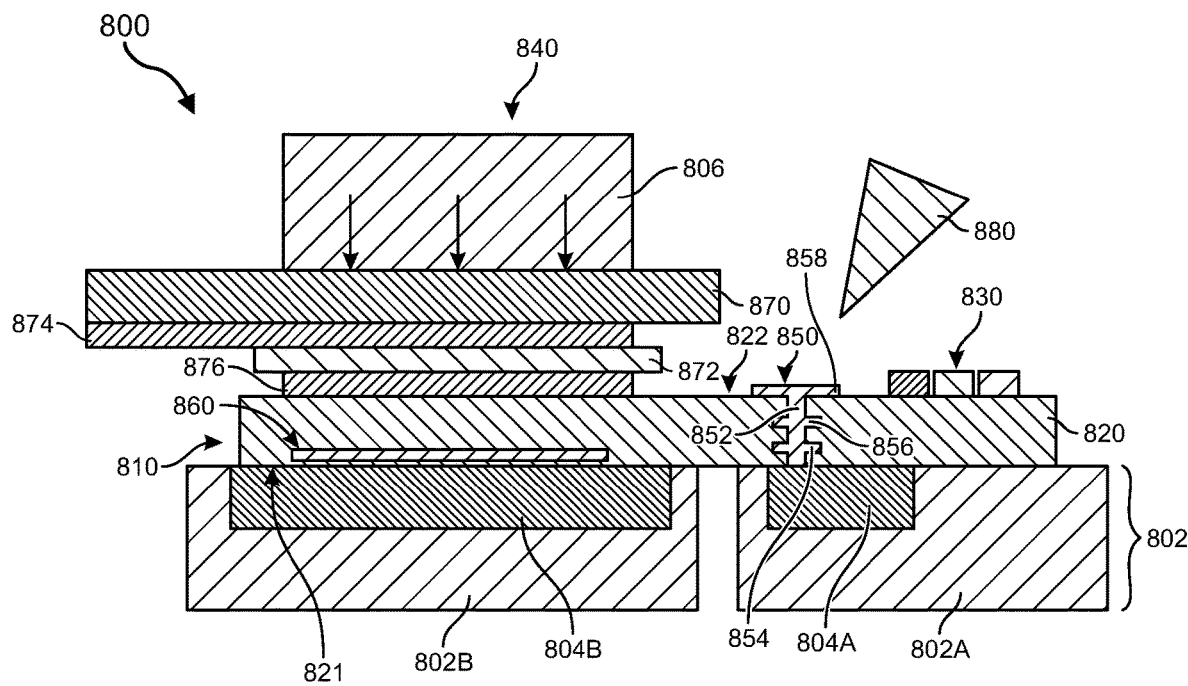
FIG. 8 shows an assembly apparatus for manufacturing an OLED package having thermal barriers embedded within a silicon backplane according to various embodiments.

Referring to FIG. 8, shown is an example apparatus for both attaching and electrically connecting an OLED device with another structure such as a flexible circuit. In certain embodiments, apparatus 800 is configured to attenuate the flow of heat to the display active area 830 from an adjacent interconnect area 840 of the OLED device 810 during and subsequent to the formation of electrical interconnects to an upper (e.g., device-side) surface 822 of silicon backplane 820.

Apparatus 800 may include a chuck 802 adapted to support a lower surface 821 of backplane 820. As illustrated, chuck 802 may include two or more temperature-controlled bonding stages, including a device area bonding stage 802A and a separate interconnect area bonding stage 802B spaced away from the device area bonding stage 802A, although such two or more bonding stages may be provided within a physically continuous (but thermally partitioned) architecture. Device area bonding stage 802A and interconnect area bonding stage 802B may respectively include a device area cooling region 804A and an interconnect area cooling region 804B each configured to actively cool an overlying region of silicon backplane 820. In certain embodiments, cooling regions 804A, 804B may thermally couple with, and extract heat from, thermal barriers 850, 860 located proximate to the display active area 830 and the interconnect area 840, respectively, of OLED device 810.

In some embodiments, electrical connections between the silicon backplane 820 and a flex circuit 870, for instance, may include wire bonds or solder ball interconnects (shown schematically in FIG. 8 as interconnect layer 872). Interconnect layer 872 may be located between a first conductive layer 874 disposed over, or proximate to, flex circuit 870 and a second conductive layer 876 disposed over, or proximate to, upper surface 822 of silicon backplane 820. First and second conductive layers 874, 876 may include bonding pads, for example. In certain embodiments, a bonding head 806 may apply heat and pressure to the flex circuit 870 during formation of the electrical connections.

A thermal barrier, such as thermal barrier 850 or thermal barrier 860, may extend at least partially around display active area 830 and form a wall or a moat configured to inhibit heat flow therethrough. In some embodiments, a thermal barrier may extend partially or entirely through the silicon backplane 820 and mediate the flow of heat from interconnect area 840 to display active area 830. In the illustrated embodiment, thermal barrier 860 underlies flex circuit 870.

By way of example, thermal barrier 850 may include a via portion 852 that extends entirely through silicon backplane 820. Thermal barrier 850 may further include fins 854, 856 embedded within the backplane that extend radially from via portion 852. A capping layer 858 may directly overlie via portion 852 as well as a portion of the upper surface 822 of silicon backplane 820. In some embodiments, a cooling gas provided by a gas jet 880 may impinge capping layer 858.

As disclosed herein, an organic light-emitting diode includes a display active area disposed over a silicon backplane. A silicon backplane may enable a greater pixel density as well as a higher contrast ratio and greater output brightness than comparative, dielectric backplanes. However, the significantly higher thermal conductivity of silicon relative to glass or polyimide may limit the available thermal budget during manufacture of such a device.

Heat generated during the formation of flip-chip (C4) interconnections, for instance, may be conducted through the backplane and adversely affect the polymer architecture within the active area of the OLED. Accordingly, in various embodiments, heat flow through the silicon backplane may be attenuated through the incorporation of structural features that block or redirect heat. Such features may be thermally insulative or thermally conductive, i.e., relative to silicon, and may be located within the silicon backplane between the display active area and one or more sources of heat.

A method of manufacturing a micro-OLED includes separately forming (i) a display active area, including an active matrix disposed over a silicon backplane, and (ii) a display driver integrated circuit (DDIC), which may include a source driver. Once formed, the active display may be bonded to the DDIC using a chip-on-flex (COF) bonding process, for example. The method may be used to manufacture lower cost, higher resolution displays having a commercially-relevant form factor (e.g., lateral dimensions greater than approximately 1.3 inches). Particularly for higher density displays, by forming the display and the DDIC separately, co-integration challenges may be avoided such that the overall manufacturing process may be more economical. For instance, while the DDIC may be formed at an 80 nm process node using CMOS technology, the display package may be assembled using a 50+ micron process node. Furthermore, in conjunction with the higher operating speeds (higher electron mobility) afforded by a silicon backplane (i.e., relative to a polymer or glass backplane), decoupling display manufacture from DDIC manufacture may enable the creation of increasingly complex data selection (multiplexers) at the display-DDIC interface, which supports higher pixel densities and image quality. Finally, in addition to implementation for micro-OLEDs, the instant approach may be applied also to micro-LEDs.

EXAMPLE EMBODIMENTS

Example 1: A display system includes a display element having an organic light emitting diode (OLED)-containing display active area disposed over a silicon backplane, a display driver integrated circuit (DDIC) attached to the display element and electrically connected with the display active area, and a thermal barrier disposed within the silicon backplane, where the thermal barrier is configured to inhibit heat flow through the silicon backplane and into the display active area.

Example 2: The display system of Example 1, where the organic light emitting diode includes a micro-OLED.

Example 3: The display system of any of Examples 1 and 2, where the silicon backplane includes single crystal silicon.

Example 4: The display system of any of Examples 1-3, where the display driver integrated circuit is disposed over a flexible substrate.

Example 5: The display system of Example 4, where the thermal barrier underlies the flexible substrate.

Example 6: The display system of any of Examples 1-5, where the display driver integrated circuit includes a source driver.

Example 7: The display system of any of Examples 1-6, where the display element is electrically connected to the display driver integrated circuit via a wire bond.

Example 8: The display system of any of Examples 1-7, where the thermal barrier is disposed between the display active area and an electrical interconnection between the display element and the display driver integrated circuit.

Example 9: The display system of any of Examples 1-8, where the thermal barrier extends entirely through a portion of the silicon backplane.

Example 10: The display system of any of Examples 1-9, where the thermal barrier extends at least partially around the display active area.

Example 11: The display system of any of Examples 1-10, where the thermal barrier includes an insulative material selected from silicon dioxide and indium gallium zinc oxide.

Example 12: The display system of any of Examples 1-10, where the thermal barrier includes a conductive material selected from copper and aluminum.

Example 13: The display system of any of Examples 1-12, where the thermal barrier includes a capping layer extending over a portion of a major surface of the silicon backplane.

Example 14: The display system of any of Examples 1-13, further including a multiplexer communicatively coupling the display element with the display driver integrated circuit.

Example 15: A display system includes a display element having an organic light emitting diode (OLED)-containing display active area disposed over a single crystal silicon backplane, and a thermal barrier disposed within the silicon backplane adjacent to the display active area, where the thermal barrier is configured to inhibit heat flow through the silicon backplane into the display active area.

Example 16: The display system of Example 15, where the thermal barrier extends entirely through a portion of the silicon backplane.

Example 17: A method includes forming a display element having an OLED-containing display active area over a silicon backplane, forming a thermal barrier within the silicon backplane adjacent to the display active area, forming a display driver integrated circuit (DDIC), and electrically connecting the display active area with the display driver integrated circuit.

Example 18: The method of Example 17, where forming the thermal barrier includes forming an opening in the silicon backplane and backfilling the opening.

Example 19: The method of Example 18, where forming the opening includes mechanical drilling or laser drilling.

Example 20: The method of any of Examples 18 and 19, where the opening extends entirely through the silicon backplane.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 900 in FIG. 9. Other artificial reality systems may include a NED that also provides visibility into the real world (e.g., augmented-reality system 1000 in FIG. 10) or that visually immerses a user in an artificial reality (e.g., virtual-reality system 1100 in FIG. 11). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 9:
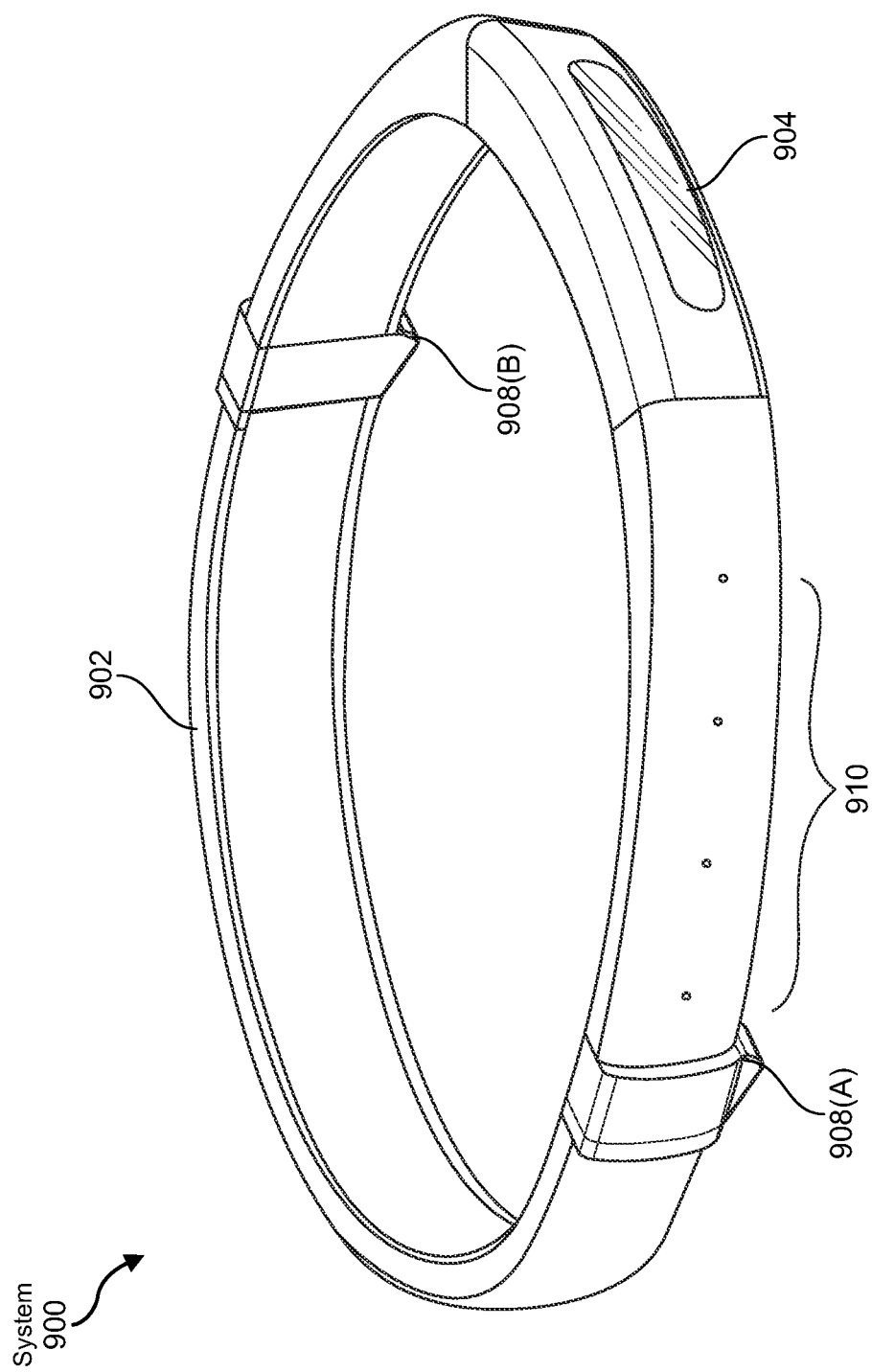
FIG. 9 is an illustration of an exemplary artificial-reality headband that may be used in connection with embodiments of this disclosure.

Turning to FIG. 9, augmented-reality system 900 generally represents a wearable device dimensioned to fit about a body part (e.g., a head) of a user. As shown in FIG. 9, system 900 may include a frame 902 and a camera assembly 904 that is coupled to frame 902 and configured to gather information about a local environment by observing the local environment. Augmented-reality system 900 may also include one or more audio devices, such as output audio transducers 908(A) and 908(B) and input audio transducers 910. Output audio transducers 908(A) and 908(B) may provide audio feedback and/or content to a user, and input audio transducers 910 may capture audio in a user's environment.

As shown, augmented-reality system 900 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 900 may not include a NED, augmented-reality system 900 may include other types of screens or visual feedback devices (e.g., a display screen integrated into a side of frame 902).

Figure 10:
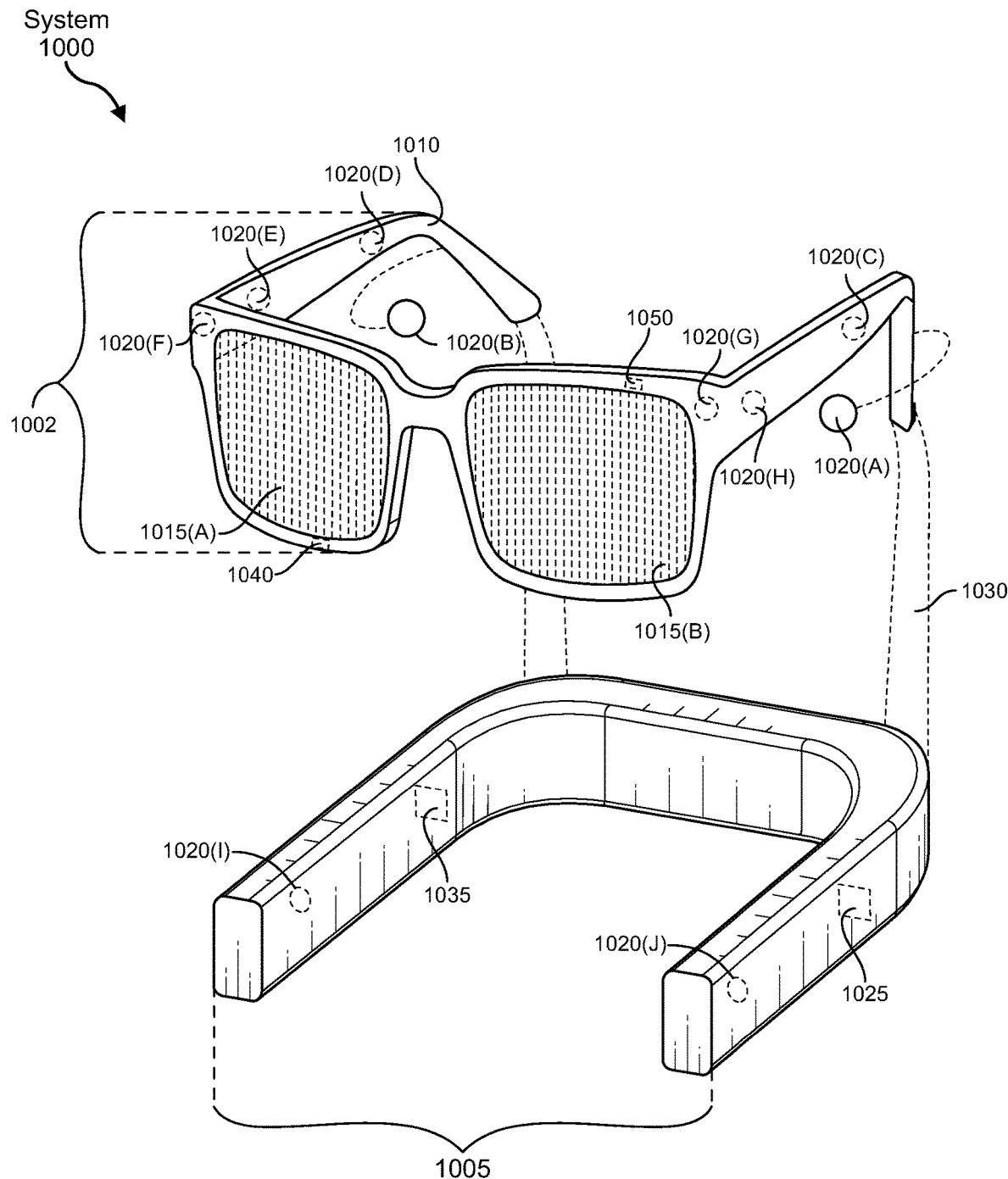
FIG. 10 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 10, augmented-reality system 1000 may include an eyewear device 1002 with a frame 1010 configured to hold a left display device 1015(A) and a right display device 1015(B) in front of a user's eyes. Display devices 1015(A) and 1015(B) may act together or independently to present an image or series of images to a user. While augmented-reality system 1000 includes two displays, embodiments of this disclosure may be implemented in augmented-reality systems with a single NED or more than two NEDs.

In some embodiments, augmented-reality system 1000 may include one or more sensors, such as sensor 1040. Sensor 1040 may generate measurement signals in response to motion of augmented-reality system 1000 and may be located on substantially any portion of frame 1010. Sensor 1040 may represent a position sensor, an inertial measurement unit (IMU), a depth camera assembly, or any combination thereof. In some embodiments, augmented-reality system 1000 may or may not include sensor 1040 or may include more than one sensor. In embodiments in which sensor 1040 includes an IMU, the IMU may generate calibration data based on measurement signals from sensor 1040. Examples of sensor 1040 may include, without limitation, accelerometers, gyroscopes, magnetometers, other suitable types of sensors that detect motion, sensors used for error correction of the IMU, or some combination thereof.

Augmented-reality system 1000 may also include a microphone array with a plurality of acoustic transducers 1020(A)-1020(J), referred to collectively as acoustic transducers 1020. Acoustic transducers 1020 may be transducers that detect air pressure variations induced by sound waves. Each acoustic transducer 1020 may be configured to detect sound and convert the detected sound into an electronic format (e.g., an analog or digital format). The microphone array in FIG. 10 may include, for example, ten acoustic transducers: 1020(A) and 1020(B), which may be designed to be placed inside a corresponding ear of the user, acoustic transducers 1020(C), 1020(D), 1020(E), 1020(F), 1020(G), and 1020(H), which may be positioned at various locations on frame 1010, and/or acoustic transducers 1020(I) and 1020(J), which may be positioned on a corresponding neckband 1005.

In some embodiments, one or more of acoustic transducers 1020(A)-(J) may be used as output transducers (e.g., speakers). For example, acoustic transducers 1020(A) and/or 1020(B) may be earbuds or any other suitable type of headphone or speaker.

The configuration of acoustic transducers 1020 of the microphone array may vary. While augmented-reality system 1000 is shown in FIG. 10 as having ten acoustic transducers 1020, the number of acoustic transducers 1020 may be greater or less than ten. In some embodiments, using higher numbers of acoustic transducers 1020 may increase the amount of audio information collected and/or the sensitivity and accuracy of the audio information. In contrast, using a lower number of acoustic transducers 1020 may decrease the computing power required by controller 1050 to process the collected audio information. In addition, the position of each acoustic transducer 1020 of the microphone array may vary. For example, the position of an acoustic transducer 1020 may include a defined position on the user, a defined coordinate on frame 1010, an orientation associated with each acoustic transducer, or some combination thereof.

Acoustic transducers 1020(A) and 1020(B) may be positioned on different parts of the user's ear, such as behind the pinna or within the auricle or fossa. Or, there may be additional acoustic transducers on or surrounding the ear in addition to acoustic transducers 1020 inside the ear canal. Having an acoustic transducer positioned next to an ear canal of a user may enable the microphone array to collect information on how sounds arrive at the ear canal. By positioning at least two of acoustic transducers 1020 on either side of a user's head (e.g., as binaural microphones), augmented-reality device 1000 may simulate binaural hearing and capture a 3D stereo sound field around about a user's head. In some embodiments, acoustic transducers 1020(A) and 1020(B) may be connected to augmented-reality system 1000 via a wired connection 1030, and in other embodiments, acoustic transducers 1020(A) and 1020(B) may be connected to augmented-reality system 1000 via a wireless connection (e.g., a Bluetooth® connection). In still other embodiments, acoustic transducers 1020(A) and 1020(B) may not be used at all in conjunction with augmented-reality system 1000.

Acoustic transducers 1020 on frame 1010 may be positioned along the length of the temples, across the bridge, above or below display devices 1015(A) and 1015(B), or some combination thereof. Acoustic transducers 1020 may be oriented such that the microphone array is able to detect sounds in a wide range of directions surrounding the user wearing the augmented-reality system 1000. In some embodiments, an optimization process may be performed during manufacturing of augmented-reality system 1000 to determine relative positioning of each acoustic transducer 1020 in the microphone array.

In some examples, augmented-reality system 1000 may include or be connected to an external device (e.g., a paired device), such as neckband 1005. Neckband 1005 generally represents any type or form of paired device. Thus, the following discussion of neckband 1005 may also apply to various other paired devices, such as charging cases, smart watches, smart phones, wrist bands, other wearable devices, hand-held controllers, tablet computers, laptop computers and other external computing devices, etc.

As shown, neckband 1005 may be coupled to eyewear device 1002 via one or more connectors. The connectors may be wired or wireless and may include electrical and/or non-electrical (e.g., structural) components. In some cases, eyewear device 1002 and neckband 1005 may operate independently without any wired or wireless connection between them. While FIG. 10 illustrates the components of eyewear device 1002 and neckband 1005 in example locations on eyewear device 1002 and neckband 1005, the components may be located elsewhere and/or distributed differently on eyewear device 1002 and/or neckband 1005. In some embodiments, the components of eyewear device 1002 and neckband 1005 may be located on one or more additional peripheral devices paired with eyewear device 1002, neckband 1005, or some combination thereof.

Pairing external devices, such as neckband 1005, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1000 may be provided by a paired device or shared between a paired device and an eyewear device, thus reducing the weight, heat profile, and form factor of the eyewear device overall while still retaining desired functionality. For example, neckband 1005 may allow components that would otherwise be included on an eyewear device to be included in neckband 1005 since users may tolerate a heavier weight load on their shoulders than they would tolerate on their heads. Neckband 1005 may also have a larger surface area over which to diffuse and disperse heat to the ambient environment. Thus, neckband 1005 may allow for greater battery and computation capacity than might otherwise have been possible on a stand-alone eyewear device. Since weight carried in neckband 1005 may be less invasive to a user than weight carried in eyewear device 1002, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 1005 may be communicatively coupled with eyewear device 1002 and/or to other devices. These other devices may provide certain functions (e.g., tracking, localizing, depth mapping, processing, storage, etc.) to augmented-reality system 1000. In the embodiment of FIG. 10, neckband 1005 may include two acoustic transducers (e.g., 1020(I) and 1020(J)) that are part of the microphone array (or potentially form their own microphone subarray). Neckband 1005 may also include a controller 1025 and a power source 1035.

Acoustic transducers 1020(I) and 1020(J) of neckband 1005 may be configured to detect sound and convert the detected sound into an electronic format (analog or digital). In the embodiment of FIG. 10, acoustic transducers 1020(I) and 1020(J) may be positioned on neckband 1005, thereby increasing the distance between the neckband acoustic transducers 1020(I) and 1020(J) and other acoustic transducers 1020 positioned on eyewear device 1002. In some cases, increasing the distance between acoustic transducers 1020 of the microphone array may improve the accuracy of beamforming performed via the microphone array. For example, if a sound is detected by acoustic transducers 1020(C) and 1020(D) and the distance between acoustic transducers 1020(C) and 1020(D) is greater than, e.g., the distance between acoustic transducers 1020(D) and 1020(E), the determined source location of the detected sound may be more accurate than if the sound had been detected by acoustic transducers 1020(D) and 1020(E).

Controller 1025 of neckband 1005 may process information generated by the sensors on neckband 1005 and/or augmented-reality system 1000. For example, controller 1025 may process information from the microphone array that describes sounds detected by the microphone array. For each detected sound, controller 1025 may perform a direction-of-arrival (DOA) estimation to estimate a direction from which the detected sound arrived at the microphone array. As the microphone array detects sounds, controller 1025 may populate an audio data set with the information. In embodiments in which augmented-reality system 1000 includes an inertial measurement unit, controller 1025 may compute all inertial and spatial calculations from the IMU located on eyewear device 1002. A connector may convey information between augmented-reality system 1000 and neckband 1005 and between augmented-reality system 1000 and controller 1025. The information may be in the form of optical data, electrical data, wireless data, or any other transmittable data form. Moving the processing of information generated by augmented-reality system 1000 to neckband 1005 may reduce weight and heat in eyewear device 1002, making it more comfortable to the user.

Power source 1035 in neckband 1005 may provide power to eyewear device 1002 and/or to neckband 1005. Power source 1035 may include, without limitation, lithium ion batteries, lithium-polymer batteries, primary lithium batteries, alkaline batteries, or any other form of power storage. In some cases, power source 1035 may be a wired power source. Including power source 1035 on neckband 1005 instead of on eyewear device 1002 may help better distribute the weight and heat generated by power source 1035.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1100 in FIG. 11, that mostly or completely covers a user's field of view. Virtual-reality system 1100 may include a front rigid body 1102 and a band 1104 shaped to fit around a user's head. Virtual-reality system 1100 may also include output audio transducers 1106(A) and 1106(B). Furthermore, while not shown in FIG. 11, front rigid body 1102 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 1100 and/or virtual-reality system 1100 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 1000 and/or virtual-reality system 1100 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 900, augmented-reality system 1000, and/or virtual-reality system 1100 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 9 and 11, output audio transducers 908(A), 908(B), 1106(A), and 1106(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 910 may include condenser microphones, dynamic microphones, ribbon microphones, and/or any other type or form of input transducer. In some embodiments, a single transducer may be used for both audio input and audio output.

Figure 11:
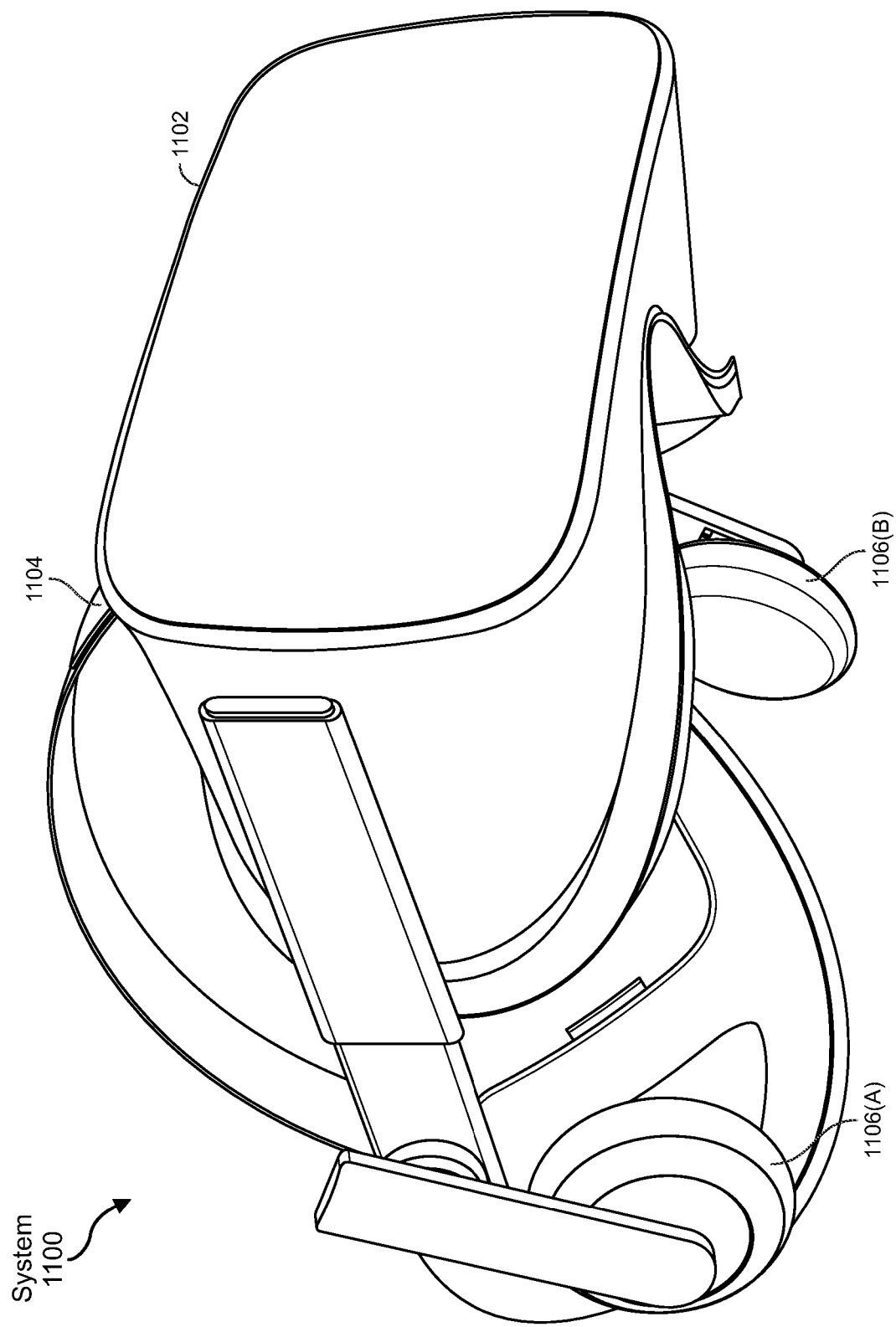
FIG. 11 is an illustration of an exemplary virtual-reality headset that may be used in connection with embodiments of this disclosure.

While not shown in FIGS. 9-11, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

In some examples, the virtual reality systems described and/or illustrated herein, including the associated OLED or LED display systems, may be implemented using any type or form of computing device or system capable of executing computer-readable instructions. In their most basic configuration, these device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

In some examples, the term "physical processor," "processing device," or "controller" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, image processors, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

In some examples, computer-executable instructions contained within modules may perform one or more of the steps, processes, and/or procedures described and/or illustrated herein. These modules may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the devices or systems described and/or illustrated herein. One or more of these modules may also represent all or portions of one or more special-purpose devices configured to perform one or more tasks.

In addition, one or more of the modules described herein may transform data, physical devices, and/or representations of physical devices from one form to another. Additionally, or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a thermally conductive layer that comprises or includes copper include embodiments where a thermally conductive layer consists essentially of copper and embodiments where a thermally conductive layer consists of copper.

What is claimed is:

1. A display system comprising:
    a display element having an organic light emitting diode (OLED)-containing display active area disposed over a silicon backplane;
    a display driver integrated circuit (DDIC) attached to the display element and electrically connected with the display active area; and
    a thermal barrier embedded within the silicon backplane and disposed between the display active area and an electrical interconnection between the display element and the display driver integrated circuit, wherein the thermal barrier is configured to inhibit heat flow through the silicon backplane and into the display active area.

2. The display system of claim 1, wherein the organic light emitting diode comprises a micro-OLED.

3. The display system of claim 1, wherein the silicon backplane is configured to enable electrical connections to transmit at least one control signal to at least one pixel emitted by the display element.

4. The display system of claim 1, wherein the display driver integrated circuit is disposed over a flexible substrate.

5. The display system of claim 4, wherein the thermal barrier embedded within the silicon backplane is adjacent to the display active area.

6. The display system of claim 1, wherein the display driver integrated circuit comprises a source driver.

7. The display system of claim 1, wherein the display element is electrically connected to the display driver integrated circuit via a wire bond.

8. The display system of claim 1, wherein the thermal barrier extends entirely through a portion of the silicon backplane.

9. The display system of claim 1, wherein the thermal barrier extends at least partially around the display active area.

10. The display system of claim 1, wherein the thermal barrier comprises an insulative material selected from the group consisting of silicon dioxide and indium gallium zinc oxide.

11. The display system of claim 1, wherein the thermal barrier comprises a conductive material selected from the group consisting of copper and aluminum.

12. The display system of claim 1, wherein the thermal barrier comprises a capping layer extending over a portion of a major surface of the silicon backplane.

13. The display system of claim 1, further comprising a multiplexer communicatively coupling the display element with the display driver integrated circuit.

14. A display system comprising:
a display element having an organic light emitting diode (OLED)-containing display active area disposed over a single crystal silicon backplane; and
a thermal barrier embedded within the single crystal silicon backplane and disposed between the display active area and an electrical interconnection between the display element and a display driver integrated circuit, wherein the thermal barrier is configured to inhibit heat flow through the silicon backplane into the display active area.

15. The display system of claim 14, wherein the thermal barrier extends entirely through a portion of the silicon backplane.

* * * * *